(12) United States Patent
Wang He

(10) Patent No.: US 9,097,956 B2
(45) Date of Patent: Aug. 4, 2015

(54) DIRECT-TYPE LIGHT EMITTING DIODE BACKLIGHT MODULE

(71) Applicant: HON HAI PRECISION INDUSTRY CO., LTD., New Taipei (TW)

(72) Inventor: Li-Ying Wang He, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 89 days.

(21) Appl. No.: 13/972,872

(22) Filed: Aug. 21, 2013

(65) Prior Publication Data

US 2014/0321102 A1   Oct. 30, 2014

(30) Foreign Application Priority Data

Apr. 26, 2013 (TW) .............. 102114936 A

(51) Int. Cl.
  *F21V 5/04* (2006.01)
  *G03B 3/00* (2006.01)
  *G02B 27/09* (2006.01)
  *H01L 33/60* (2010.01)

(52) U.S. Cl.
  CPC .............. *G03B 3/00* (2013.01); *G02B 27/0961* (2013.01); *H01L 33/60* (2013.01); *F21V 5/04* (2013.01); *G02B 27/0972* (2013.01)

(58) Field of Classification Search
  CPC .............. G02B 27/095; G02B 27/0955; G02B 27/09691; G02B 27/0972; F21V 5/04; G03B 3/00; H01L 33/54; H01L 33/58; H01L 33/60
  USPC ........................................ 362/311.02; 257/98
  See application file for complete search history.

(56) References Cited

U.S. PATENT DOCUMENTS

| 8,905,596 B2* | 12/2014 | Wang He ................. 362/311.02 |
| 2006/0102914 A1* | 5/2006 | Smits et al. .................... 257/98 |
| 2013/0075776 A1* | 3/2013 | Murai et al. .................... 257/98 |

* cited by examiner

*Primary Examiner* — Stephen F Husar
(74) *Attorney, Agent, or Firm* — Novak Druce Connolly Bove + Quigg LLP

(57) ABSTRACT

A direct-type LED backlight module includes a backlight plate, an LED mounted on the backlight plate to emit light, and a lens mounted on the backlight plate and encapsulating the LED therein. The lens includes a light input part to allow the light in, a light output part extending from a top surface of the light input part to allow the light radiate out from a periphery thereof, and a microstructure formed on a bottom surface of the light input part to reflect a part of light reflected by the light output part to make the reflected light travel through a central portion of the light output part.

14 Claims, 5 Drawing Sheets

DIRECT-TYPE LIGHT EMITTING DIODE BACKLIGHT MODULE

BACKGROUND

1. Technical Field

The present disclosure relates to backlight modules, and more particularly to a direct-type light emitting diode (LED) backlight module.

2. Description of Related Art

A conventional direct-type LED backlight module includes a backlight plate, a plurality of LEDs mounted on the backlight plate and a lens covering the LEDs and mounted on the backlight plate. The lens includes a light input surface and a light output surface extending from the light input surface. Light emitted from the LEDs travels through the light input surface and radiates out from a periphery of the light output surface to illuminate. However, the light is concentrated on a periphery of a light field. Therefore, a central portion of the light field is darker than other portions (shown in FIG. 1). Thus, the light of the conventional direct-type LED backlight module is unevenly distributed.

What is needed, therefore, is an improved direct-type LED backlight module which overcomes the above described shortcomings.

DETAILED DESCRIPTION

An embodiment of a direct-type LED backlight module in accordance with the present disclosure will now be described in detail below and with reference to the drawings.

Figure 1:
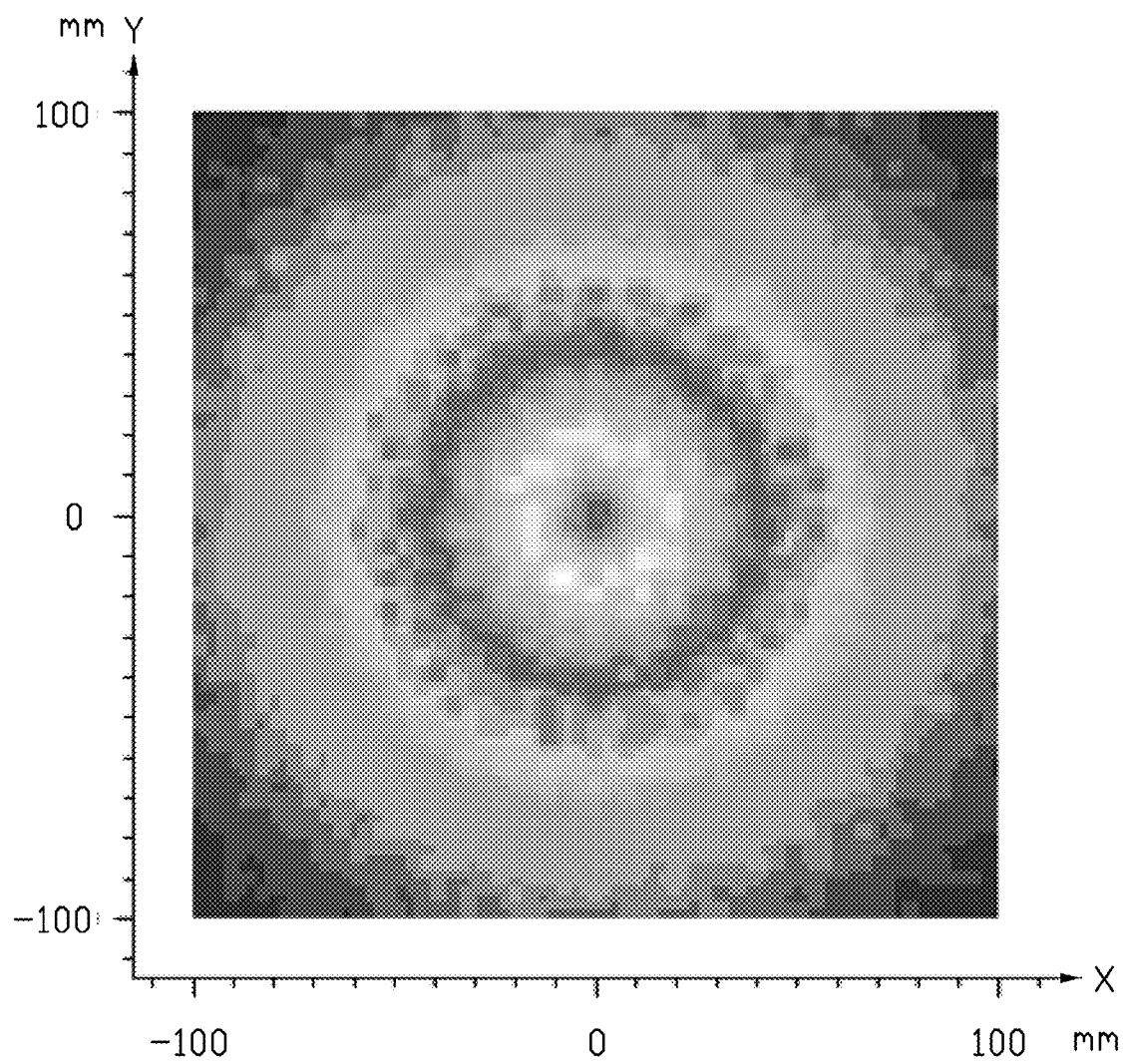
FIG. 1 is a schematic view of a light field of a conventional direct-type LED backlight module.
Figure 2:
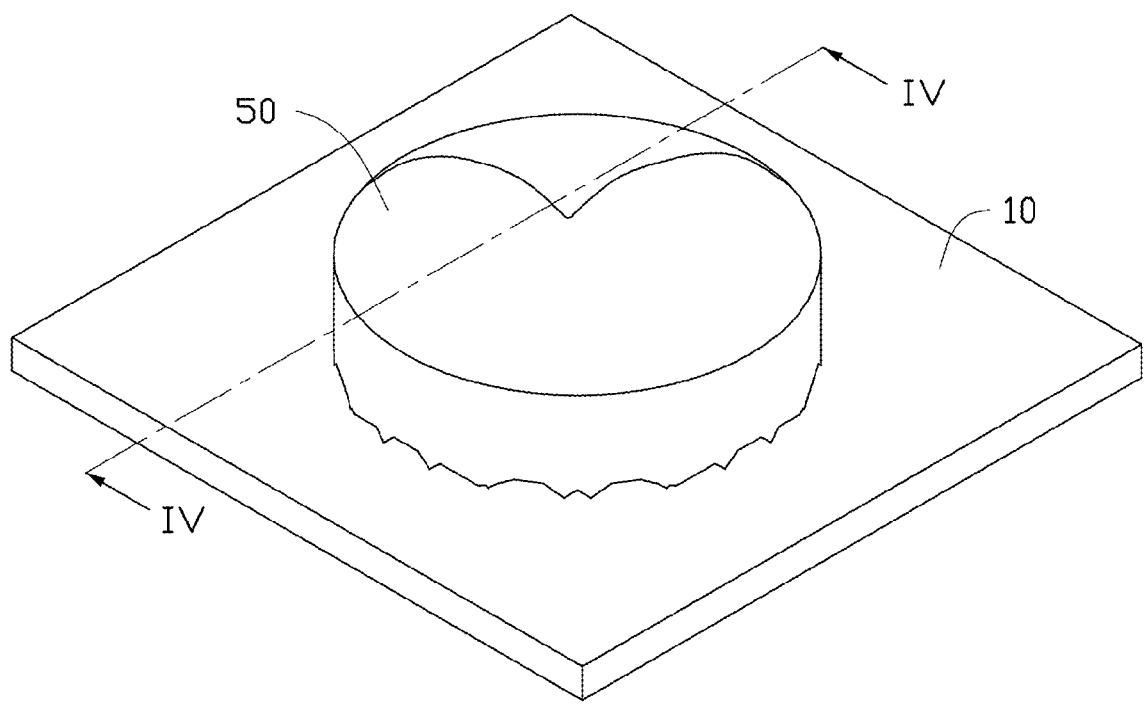
FIG. 2 is an isometric view of a direct-type LED backlight module according to an exemplary embodiment of the present disclosure.
Figure 3:
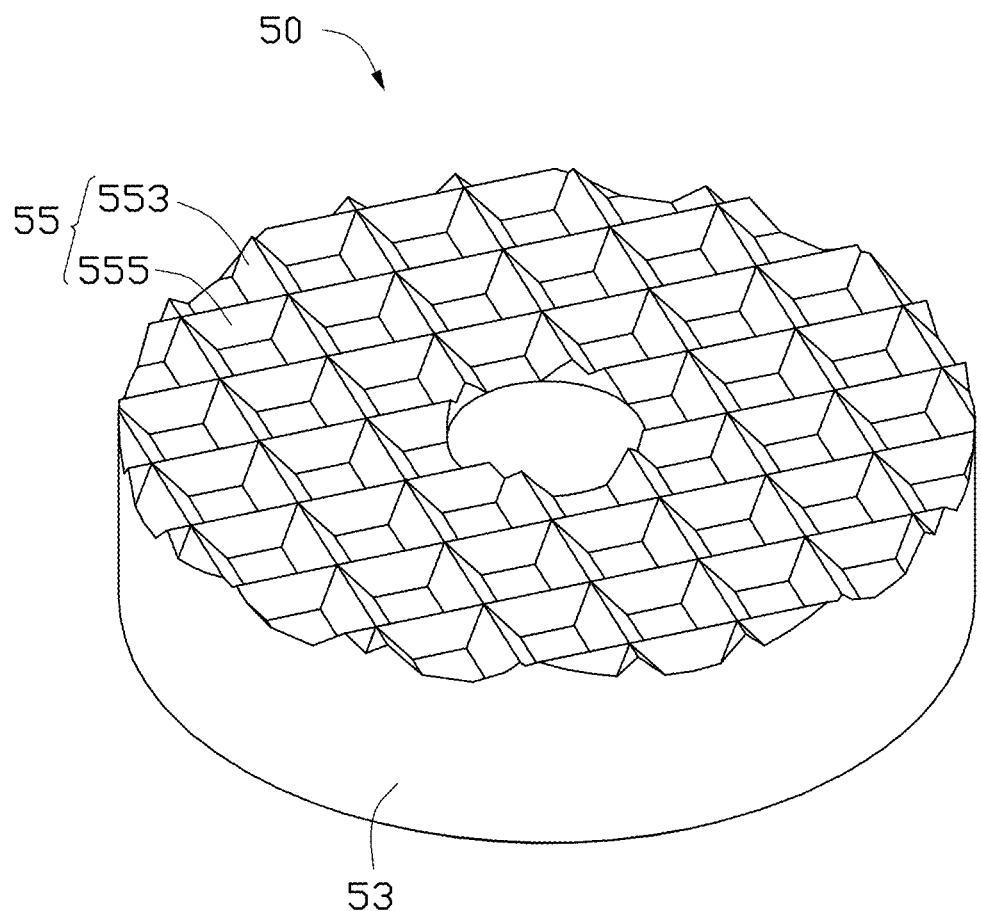
FIG. 3 is an inverted view of a lens of the direct-type LED backlight module of FIG. 2.
Figure 4:
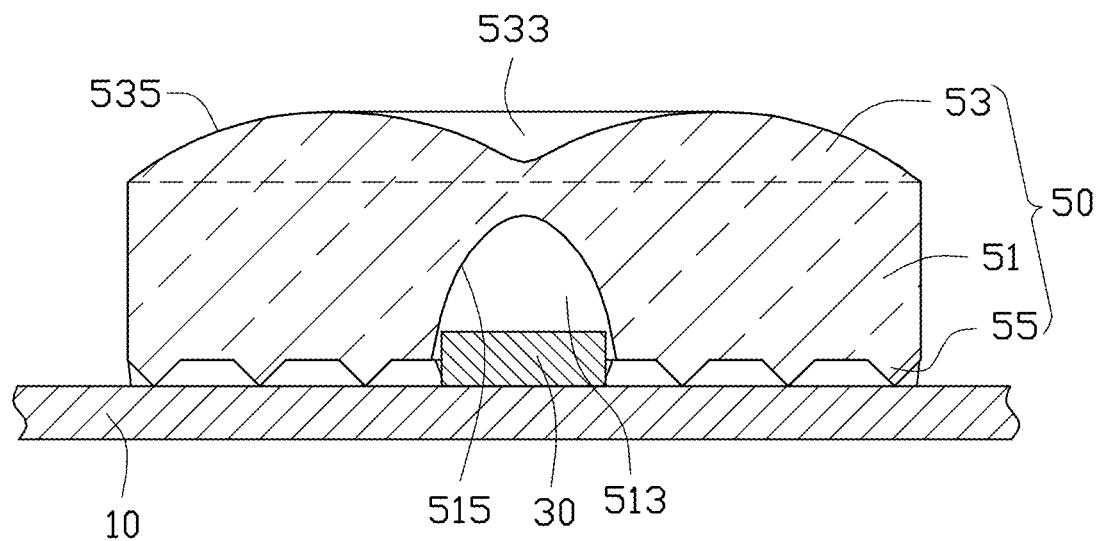
FIG. 4 is a cross sectional view of the direct-type LED backlight module of FIG. 2.

Referring to FIGS. 2 to 4, a direct-type LED backlight module in accordance with an exemplary embodiment of the disclosure includes a backlight plate 10, an LED 30 mounted on the backlight plate 10 and a lens 50 mounted on the backlight plate 10 and encapsulating the LED 30 therein.

The lens 50 is made of material with high light transmittance, for example, glass, PMMA (polymethylmethacrylate) or PC (polycarbonate). The lens 50 has a light axis superposition with a light axis of the LED 30. The lens 50 includes a light input part 51, a light output part 53 extending upwardly from a top surface of the light input part 51, and a microstructure 55 formed on a bottom surface of the light input part 51. The light input part 51 and the light output part 53 are coaxial.

The light input part 51 is cylindrical and has a rectangular cross section. A central portion of the bottom surface of the light input part 51 is recessed towards the top surface to define a receiving hole 513 to receive the LED 30 therein. The receiving hole 513 is domical. A bore diameter of the receiving hole 513 decreases from bottom to top. An inner surface of the receiving hole 513 is a light input surface 515 of the lens 50.

The light output part 53 is protruded from the top surface of the light input part 51. A diameter of the light output part 53 decreases from bottom to top. A top surface of the light output part 53 is convex and acts as a light output surface 535 of the lens 50. A central portion of the light output surface 535 is recessed to define a recess 533 therein. A cross section of the light output part 53 is M-shaped. The cross section of the recess 533 is V-shaped.

The microstructure 55 includes a plurality of triangular prism groups. Each triangular prism group includes a first triangular prism 553 and a second triangular prism 555 cross connecting the first triangular prism 553 at central portions. The first triangular prism 553 and the second triangular prism 555 lie at an angle about 90 degrees, that is to say, the first triangular prism 553 perpendicularly intersects with the second triangular prism 555. A structure of the first triangular prism 553 is the same as that of the second triangular prism 555. A length of each the first triangular prism 553 and the second triangular prism 555 is 1 millimeter. A top end of the first triangular prism 553 is coplanar to a top end of the second triangular prism prism 555. A bottom end of the first triangular prism 555 is coplanar to a bottom end of the second triangular 555. The first triangular prisms 553 cooperatively form a plurality of rows spaced from and parallel to each other. Opposite ends of the first triangular prism 553 interconnect ends of two adjacent first triangular prisms 553 of each row. The second triangular prisms 555 cooperatively form a plurality of lines spaced from and parallel to each other. Opposite ends of the second triangular prism 555 interconnect ends of two adjacent second triangular prisms 555 of each line.

In operation, light emitted from the LED 30 travels into the lens 50 via the light input surface 515 and radiates towards the light output surface 535. A part of such incident light directly travels through a periphery of the light output surface 535 to illuminate. Another part of the incident light is totally reflected by the light output surface 535 to the microstructure 55. The microstructure 55 reflects the light oriented thereto to different directions to change the incidence angle of the light to make a part of the light vertically travels through whole of the light output surface 535 and be evenly distributed, a part of the light be concentrated and travels through a central of the light output surface 535, and another part of the light radiate toward the periphery of the light output surface 535. The great majority of the another part of the light is totally reflected by the light output surface 535, radiates towards the microstructure 55 again, and reflects by the microstructure 55 to vertically, evenly travel through the whole of the light output surface 535 and the central portion of the light output surface 535.

Figure 5:
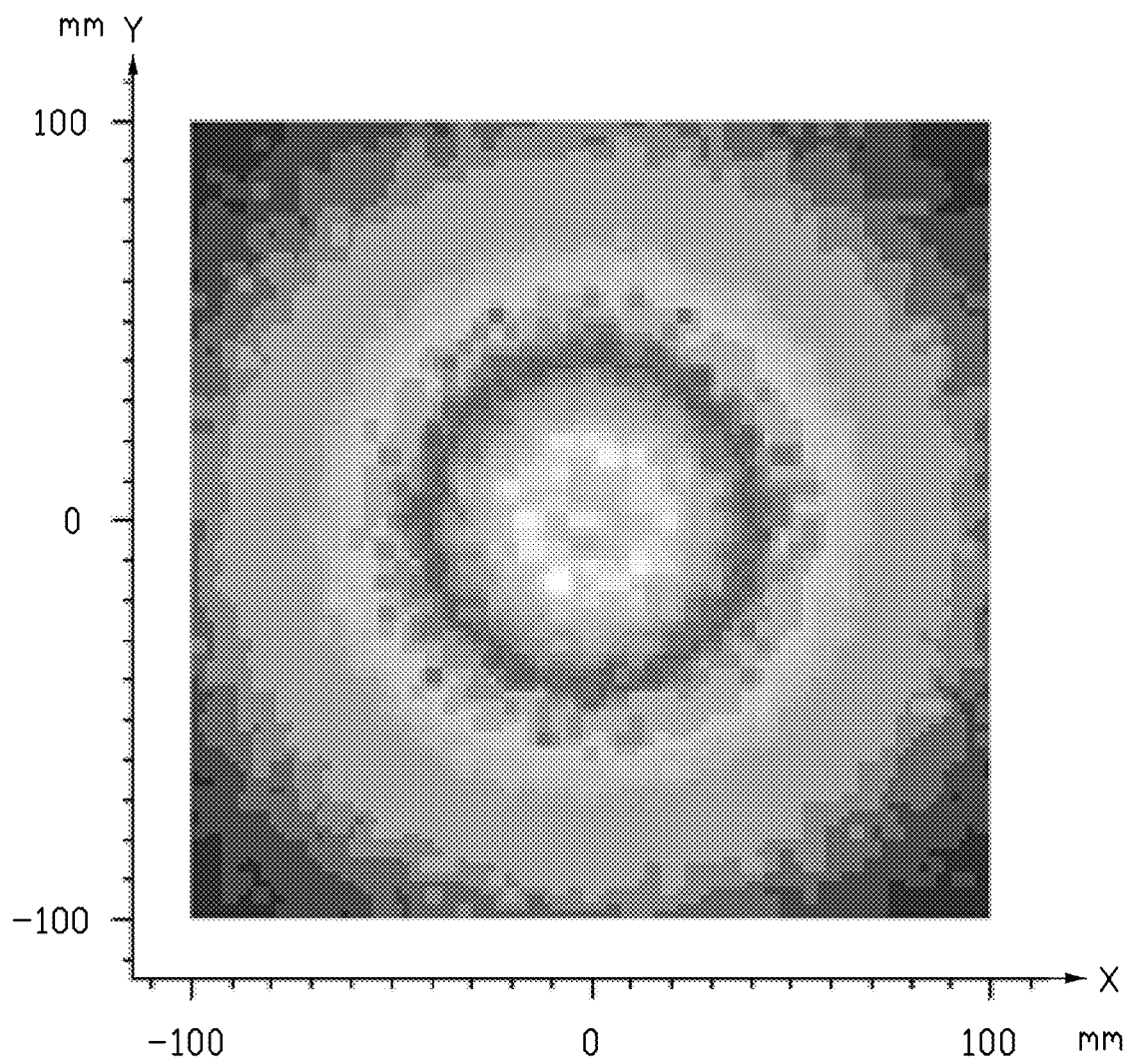
FIG. 5 is a schematic view of a light field of the direct-type LED backlight module of FIG. 2.

Referring to FIG. 5, in this disclosure, because the microstructure 55 reflects the light reflected back into the lens 50 by the light output surface 535 from different direction, a part of the light is concentrated and travels through the light output surface 535 from the central portion of the light output surface 535. Thus, the intensity of a central portion of a light field of the present disclosure is enhanced relative to the light filed of the conventional direct-type LED backlight module. In this state, not only the light can be evenly distributed in the light field, but also the light extraction efficiency of the direct-type LED backlight module is improved.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A direct-type light emitting diode (LED) backlight module comprising:
   a backlight plate;
   an LED mounted on the backlight plate to emit light; and
   a lens mounted on the backlight plate and encapsulating the LED therein, the lens comprising a light input part to allow the light incident in, a light output part extending from a top surface of the light input part to allow the light radiate out from a periphery thereof, and a microstructure formed on a bottom surface of the light input part to reflect a part of light reflected by the light output part to make the reflected light travel through a central portion of the light output part.

2. The direct-type LED backlight module of claim 1, wherein the microstructure comprises a plurality of triangular prism groups, and each triangular prism group comprises a first triangular prism and a second triangular prism cross connecting the first triangular prism.

3. The direct-type LED backlight module of claim 2, wherein the first triangular prism and the second triangular prism are cross connected at central portions of the first triangular prism and the second triangular prism.

4. The direct-type LED backlight module of claim 3, wherein the first triangular prism lies at an angle about 90 degrees to the second triangular prism.

5. The direct-type LED backlight module of claim 2, wherein a structure of the first triangular prism is the same as that of the second triangular prism.

6. The direct-type LED backlight module of claim 5, wherein a length of each of the first triangular prism and the second triangular prism is 1 millimeter.

7. The direct-type LED backlight module of claim 2, wherein a top end of the first triangular prism is coplanar with a top end of the second triangular prism prism, and a bottom end of the first triangular prism is coplanar with a bottom end of the second triangular.

8. The direct-type LED backlight module of claim 2, wherein the first triangular prisms cooperatively form a plurality of rows spaced from and parallel to each other.

9. The direct-type LED backlight module of claim 8, wherein opposite ends of the first triangular prism interconnect ends of two adjacent first triangular prisms of each row.

10. The direct-type LED backlight module of claim 8, wherein the second triangular prisms cooperatively form a plurality of lines spaced from and parallel to each other.

11. The direct-type LED backlight module of claim 10, wherein opposite ends of the second triangular prism interconnect ends of two adjacent second triangular prisms of each line.

12. The direct-type LED backlight module of claim 1, wherein a cross section of light output part is M-shaped, and a recess is defined in a central portion of the light output part.

13. The direct-type LED backlight module of claim 1, wherein a cross section of the light input part is rectangular, and a receiving hole is defined in a bottom end of the light input part to receive the LED therein.

14. The direct-type LED backlight module of claim 1, wherein the light input part and the light output part are coaxial.

* * * * *